(12) United States Patent
Ou et al.

(10) Patent No.: US 7,941,778 B2
(45) Date of Patent: May 10, 2011

(54) SYSTEM AND METHOD OF DETERMINING MINIMUM COST PATH

(75) Inventors: Canhui Ou, Danville, CA (US); Jian Li, Sunnyvale, CA (US); Steven Gemelos, Cupertino, CA (US); Howard Scott Mountford, Danville, CA (US); Brent Edward Jacobson, Chino Hills, CA (US); Orlando Echeverria-Calvet, San Ramon, CA (US); Thomas Cronin, Danville, CA (US); Jerold Daizo Osato, Pinole, CA (US)

(73) Assignee: AT&T Intellectual Property I, LP, Reno, NV (US)

( * ) Notice: Subject to any disclaimer, the term of this patent is extended or adjusted under 35 U.S.C. 154(b) by 806 days.

(21) Appl. No.: 11/940,842

(22) Filed: Nov. 15, 2007

(65) Prior Publication Data
US 2009/0132989 A1    May 21, 2009

(51) Int. Cl.
G06F 17/50 (2006.01)
H04J 14/00 (2006.01)
H04B 10/20 (2006.01)

(52) U.S. Cl. .......................... 716/126; 398/57; 398/58
(58) Field of Classification Search .................. 716/12, 716/126; 398/57, 58
See application file for complete search history.

(56) References Cited

U.S. PATENT DOCUMENTS

| | | | |
|---|---|---|---|
| 6,564,145 B2 | 5/2003 | Kim et al. | |
| 6,842,723 B2 | 1/2005 | Alicherry et al. | |
| 6,996,342 B2 | 2/2006 | Park et al. | |
| 7,155,120 B1 | 12/2006 | Ofek et al. | |
| 7,171,124 B2 | 1/2007 | Smith et al. | |
| 7,180,852 B1 | 2/2007 | Doverspike et al. | |
| 7,218,851 B1 | 5/2007 | Zang | |
| 7,689,120 B2 * | 3/2010 | Hoang et al. | 398/57 |
| 2003/0033394 A1 | 2/2003 | Stine | |
| 2003/0035166 A1 | 2/2003 | Zhang et al. | |
| 2004/0186696 A1 | 9/2004 | Alicherry et al. | |
| 2004/0247317 A1 | 12/2004 | Sadananda | |
| 2005/0220136 A1 | 10/2005 | Shinomiya et al. | |
| 2005/0232157 A1 | 10/2005 | Tyan et al. | |
| 2007/0212068 A1 * | 9/2007 | Miyazaki et al. | 398/57 |

OTHER PUBLICATIONS

Chen et al.; "A New Model for Optimal Routing and Wavelength Assignment in Wavelength Division Multiplexed Optical Networks"; 1996; Stevens Institute of Technology; pp. 1-8.*

Frigo et al.; "A Wavelength-Division Multiplexed Passive Optical Network with Cost-Shared Components"; Nov. 1994; IEEE Photonics Technology Letters, vol. 6, No. 11; pp. 1-3.*

* cited by examiner

Primary Examiner — Sun J Lin
Assistant Examiner — Suresh Memula
(74) Attorney, Agent, or Firm — Larson Newman & Abel, LLP

(57) ABSTRACT

A network is represented using a graph. The graph comprises a plurality of vertices and a plurality of edges. The vertices comprise a source vertex, a destination vertex and a vertex u. The edges link corresponding adjacent pairs of the vertices. A minimum cost path in the graph is determined from the source vertex to the destination vertex, wherein the vertex u is in the minimum cost path. An edge from the vertex u in the minimum cost path introduces an additional capital expenditure cost that is dependent on how the minimum cost path traverses from the source vertex to the vertex u.

24 Claims, 8 Drawing Sheets

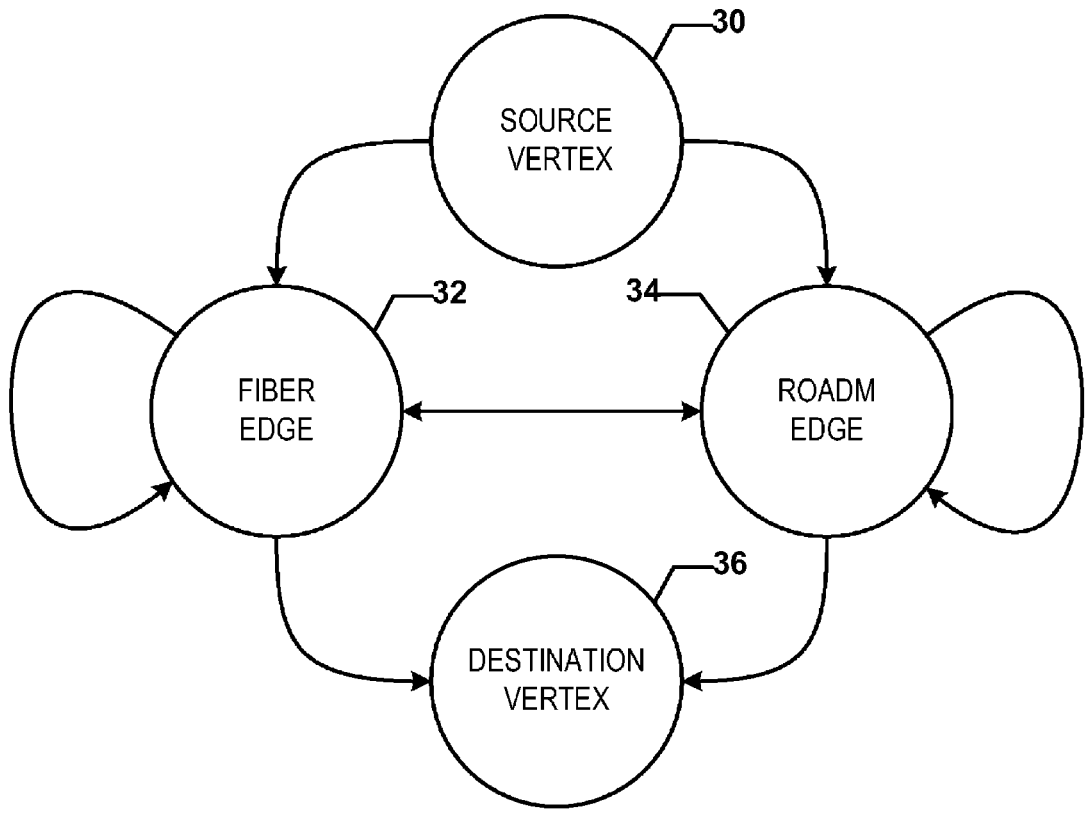

*FIG. 2*

```
class PathCapEx {
    float fLoss; //dB loss along the path
    float fCapEx; //path's capital expenditure
    float fFiberCost; //path's fiber cost
    int nSegmentStartType; // there are three types:
                    // SEGMENT_START_FROM_7750
                    // SEGMENT_START_FROM_7500_VIA_LAMBDA
                    // SEGMENT_START_FROM_7500_VIA_FIBER public PathCapEx(float fLoss, float fCapEx, float fFiberCost, int nType)
    {
        //do value assignment
    }
}
```

*FIG. 3*

```
execute (vertex source, vertex destination) {
        SET settledNodes = {};
        SET unsettledNodes = {};
        MAP shortestDistances = {};
        MAP predecessors = {};

setShortestDistances(source, distance(0));

while ((vertex u = extractMin() != null) {
                if (vertex u == destination)
                        exit successfully;

settledNodes.add(vertex u);

relaxNeighbors(vertex u);
        }
}
```

FIG. 4

```
setShortestDistance(Vertex v, float distance)
{
        remove vertex v from unsettledNodes;

shortestDistances.put(v, new Float(distance));

add vertex v back to unsettledNodes and re-balance the sorted set based on the
                new shortest distance;
}
```

FIG. 5

```
extractMin()
{
        vertex min = find the vertex in unsettledNodes which has the shortest distance;
        unsettledNodes.remove(vertex min);
        return min;
}
```

FIG. 6

```
relaxNeighbors(vertex u)
{
80    PathCapEx hCapExU = getMinCapEx(u);
      get this list of neighbors of vertex u;
      for each neighbor v of vertex u, do the following:
90    {
          if (vertex v is settled)
              skip vertex v;
          //calculate fLoss, fCapEx, and fFiberCost based on the following cases
          //also update nSegmentStartType for path_upto_v
100       if (link(u, v) is a ROADM hop)
          {
              path_upto_u.nSegmentStartType must be SEGMENT_START_FROM_7500_VIA_LAMBDA; otherwise error.
              set path_upto_v.nSegmentStartType = SEGMENT_START_FROM_7500_VIA_LAMBDA;
              calculate fLossV, fCapExV, and fFiberCostV accordingly;  (case A)
110       }
          else if (link(u, v) is a ROADM_Auxilary hop)
          {
              if (link(u, v) is a ROADM_Aux_Hub hop)
              {
                  path_upto_u.nSegmentStartType must be SEGMENT_START_FROM_7500_VIA_LAMBDA; otherwise error.
                  set path_upto_v.nSegmentStartType = SEGMENT_START_FROM_7500_VIA_LAMBDA;
                  calculate fLossV, fCapExV, and fFiberCostV accordingly;  (case B)
              }
              else {
                  //for non-hub ROADM_Auxilary hop: three different cases based on path_upto_u.nSegmentStartType;
                  //we need to adjust path_upto_v.nSegmentStartType accordingly
                  if (path_upto_u.nSegmentStartType == SEGMENT_START_FROM_7750) {
                      set path_upto_v.nSegmentStartType = SEGMENT_START_FROM_7500_VIA_LAMBDA;
                  } else if (path_upto_u.nSegmentStartType == SEGMENT_START_FROM_7500_VIA_FIBER) {
                      set path_upto_v.nSegmentStartType = SEGMENT_START_FROM_7500_VIA_LAMBDA;
                  } else if (path_upto_u.nSegmentStartType == SEGMENT_START_FROM_7500_VIA_LAMBDA) {
                      set path_upto_v.nSegmentStartType = SEGMENT_START_FROM_7500_VIA_FIBER;
                  } else {
                      error;
                  }
                  calculate fLossV, fCapExV, and fFiberCostV accordingly;  (case C)
              }
120       }
          else //which means link(u,v) is a fiber hop
          {
              //there are two cases for a fiber hop:
              // i) it starts from a 7750 router; or
              //ii) it starts from a 7500 ROADM node
              if (path_upto_u.nSegmentStartType == SEGMENT_START_FROM_7750) {
                  set path_upto_v.nSegmentStartType = SEGMENT_START_FROM_7750;
                  calculate fLossV, fCapExV, and fFiberCostV accordingly;  (case D)
              }
              else if (path_upto_u.nSegmentStartType == SEGMENT_START_FROM_7500_VIA_FIBER) {
                  set path_upto_v.nSegmentStartType = SEGMENT_START_FROM_7500_VIA_FIBER;
                  calculate fLossV, fCapExV, and fFiberCostV accordingly;  (case E)
              }
              else {
                  error
              }
          }
130       //update minCapEx for vertex v (i.e., path_upto_v)
          PathCapEx hCapExV = getMinCapEx(v);
          if (null == hCapExV) {
              hCapExV = new PathCapEx(fLossV, fCapExV, fFiberCostV, nSegmentType);
              setMinCapEx(v, hCapExV);
          } else if (hCapExV.fCapEx > fCapExV) {
              hCapExV = new PathCapEx(fLossV, fCapExV, fFiberCostV, nSegmentType);
              setMinCapEx(v, hCapExV);
          }
140       // assign predecessor in shortest path
          setPredecessor(v, u);
      }
}
```

*FIG. 7*

```
setPredecessor(v, u)
{
        predecessors.put(v, u);   //adding new entry (v --> u) to the predecessors map
}
```

*FIG. 8*

|  | LINK FROM U TO V IS A ROADM HOP | LINK FROM U TO V IS A HUB ROADM AUX HOP | LINK FROM U TO V IS A NON-HUB ROADM AUX HOP | LINK FROM U TO V IS A FIBER HOP |
|---|---|---|---|---|
| SEGMENT START FOR U IS ROADM VIA LAMBDA | (CASE A) SET SEGMENT START FOR V TO ROADM VIA LAMBDA | (CASE B) SET SEGMENT START FOR V TO ROADM VIA LAMBDA | (CASE C) SET SEGMENT START FOR V TO ROADM VIA FIBER | N/A |
| SEGMENT START FOR U IS ROUTER | N/A | N/A | (CASE C) SET SEGMENT START FOR V TO ROADM VIA LAMBDA | (CASE D) SET SEGMENT START FOR V TO ROUTER |
| SEGMENT START FOR U IS ROADM VIA FIBER | N/A | N/A | (CASE C) SET SEGMENT START FOR V TO ROADM VIA LAMBDA | (CASE E) SET SEGMENT START FOR V TO ROADM VIA FIBER |

*FIG. 9*

150 → (1) case A:
fLossV = UniversalConstants.FIBER_LOSS_PER_CO; //constant dB loss for a CO (the dummy node)
fCapExV = hCapExU.fCapEx + amortized cost for lamda access module, e.g.
       hMetroGraph.hConfiguration.hROADM_Properties.nLambdaAccessModule/8;
fFiberCostV = hCapExU.fFiberCost + amortized cost for laying new fiber, e.g.
       (hFLink.length * hFLink.costNewFiber) / UniversalConstants.WAVELENGTHS_PER_FIBER;
checkIfDestIsReached(v);

152 → (2) case B:
fLossV = UniversalConstants.FIBER_LOSS_PER_CO;
fCapExV = hCapExU.fCapEx + double times amortized cost for lamda access module, e.g.
       2 * (hMetroGraph.hConfiguration.hROADM_Properties.nLambdaAccessModule/8);
fFiberCostV = hCapExU.fFiberCost;
checkIfDestIsReached(v);

154 → (3) case C:
fLossV = UniversalConstants.FIBER_LOSS_PER_CO;
fCapExV = hCapExU.fCapEx + optic interface cost, e.g.
       hMetroGraph.hConfiguration.hROADM_Properties.getOpticCostByLoss(hCapExU.fLoss);
fFiberCostV = hCapExU.fFiberCost;
checkIfDestIsReachedv();

156 → (4) case D:
fLossV = hCapExU.fLoss + hFLink.loss1550 + UniversalConstants.FIBER_LOSS_PER_CO;
fFiberCostV = hCapExU.fFiberCost + hFLink.length * hFLink.costSpareFiber;
//CapExV
int nMDATypeU = hMetroGraph.hConfiguration.getMDATypeByPowerBudget(hCapExU.fLoss);
int nMDATypeV = hMetroGraph.hConfiguration.getMDATypeByPowerBudget(fLossV);
if (nMDATypeU == nMDATypeV) {
       fCapExV = hCapExU.fCapEx;
} else {
       float fCapExDiff = hMetroGraph.hConfiguration.get7750MDACost(nMDATypeV)
                     - hMetroGraph.hConfiguration.get7750MDACost(nMDATypeU);
       if (fCapExDiff >= 0) {
              fCapExV = hCapExU.fCapEx + fCapExDiff;
       } else {
              error;
       }
}
checkIfDestIsReached(v);

160 → (5) case E:
fLossV = hCapExU.fLoss + hFLink.loss1550 + UniversalConstants.FIBER_LOSS_PER_CO;
fFiberCostV = hCapExU.fFiberCost + hFLink.length * hFLink.costSpareFiber;
float fCapExDiff = hMetroGraph.hConfiguration.hROADM_Properties.getOpticCostByLoss(fLossV)
                     - hMetroGraph.hConfiguration.hROADM_Properties.getOpticCostByLoss(hCapExU.fLoss);
if (fCapExDiff >= 0) {
       fCapExV = hCapExU.fCapEx + fCapExDiff;
} else {
       error
}
checkIfDestIsReached(v);

*FIG. 10*

```
procedure checkIfDestIsReached(vertex v) {
    if (vertex v == Dest)) {
        //we have reached Dest node, need to add optic interface cost
        int nMDATypeV =
hMetroGraph.hConfiguration.getMDATypeByPowerBudget(fLossV);
        float fCapExDstOptic;
        if (SEGMENT_IO_TO_EO == nPathType) {
            fCapExDstOptic =
hMetroGraph.hConfiguration.get7450MDACost(nMDATypeV);
        } else {
            fCapExDstOptic =
hMetroGraph.hConfiguration.get7750MDACost(nMDATypeV);
        }
        fCapExV += fCapExDstOptic;
    }
}
```

FIG. 11

```
getShortestPath(vertex destination)
{
    d = getShortestDistance(vertex destination);
    if (d == INFINITE_DISTANCE)
        return no_path;

repeatedly calling pred=getPredecessor(v) and append vertex pred to path, until v==source reverse(path);

return path;
}
```

FIG. 12

```
getPredecessor(v)
{
    vertex u = predecessors.get(v); //finding the entry whose key is v
    return u;
}
```

FIG. 13

SYSTEM AND METHOD OF DETERMINING MINIMUM COST PATH

FIELD OF THE DISCLOSURE

The present disclosure is generally related to routing in communication networks.

BACKGROUND

Wavelength division multiplexing (WDM) equipment, such as Reconfigurable Optical Add/Drop Multiplexers (ROADMs), is deployed for fiber relief and reach extension. Fiber relief saves the cost of laying new fiber. Reach extension reduces the need for long-reach, more expensive optics.

BRIEF DESCRIPTION OF THE DRAWINGS

FIG. 2 is a diagram of a finite-state machine to illustrate an embodiment of an algorithm to determine a minimum cost path;

FIG. 3 is pseudocode of an embodiment of a data structure to model a capital expenditure of a path;

FIG. 4 is pseudocode of an embodiment of a first process in an embodiment of an algorithm to find a minimum capital expenditure from a source vertex to a destination vertex;

FIG. 5 is pseudocode of an embodiment of a second process in an embodiment of the algorithm;

FIG. 6 is pseudocode of an embodiment of a third process in an embodiment of the algorithm;

FIG. 7 is pseudocode of an embodiment of a relaxation process in an embodiment of the algorithm;

FIG. 8 is pseudocode of an embodiment of a set predecessor process in an embodiment of the algorithm;

FIG. 9 is a table that summarizes different cases for determining a segment start value;

FIG. 10 is pseudocode of an embodiment of a process for calculating values of a loss along the path to the vertex v, the capital expenditure of the path to the vertex v, and a fiber cost of the path to the vertex v;

FIG. 11 is pseudocode of an embodiment of a process to check if a destination vertex is reached;

FIG. 12 is pseudocode of an embodiment of a process to get a shortest path;

FIG. 13 is pseudocode of an embodiment of a get predecessor process; and

DETAILED DESCRIPTION OF THE DRAWINGS

Determining how to route circuits in an economical manner to take advantage of a hybrid transport with spare fibers and deployed WDM equipment is a challenge. Intuitively, it is more economical to route a circuit over spare fibers when the loss of the route is low and many spare fibers are available along the route. On the other hand, it might be more economical to route a segment of a circuit or even an entire circuit over WDM equipment if the loss of the entire route is high or there is few spare fibers available along the route. Thus, determining when to use spare fibers and when to use WDM equipment may be challenging.

Disclosed herein are embodiments of methods of routing circuits on top of a hybrid transport with spare fiber and WDM equipment. Embodiments determine when to use spare fibers and when to use WDM equipment based on the following factors: cost of WDM equipment; loss, which translates to the cost of optical interfaces of layer 2 and layer 3 equipment; cost of spare fibers; and cost of laying new fibers. Embodiments determine the routing by applying a modified shortest-path algorithm to an augmented graph which represents the network with deployed WDM equipment and potential new fiber cables. Embodiments may act to minimize capital expenditure (CapEx) and extend reach. Thus, as used herein, the phrases "shortest distance" and "shortest path" refer to "minimum cost" and "minimum cost path", respectively.

Figure 1:
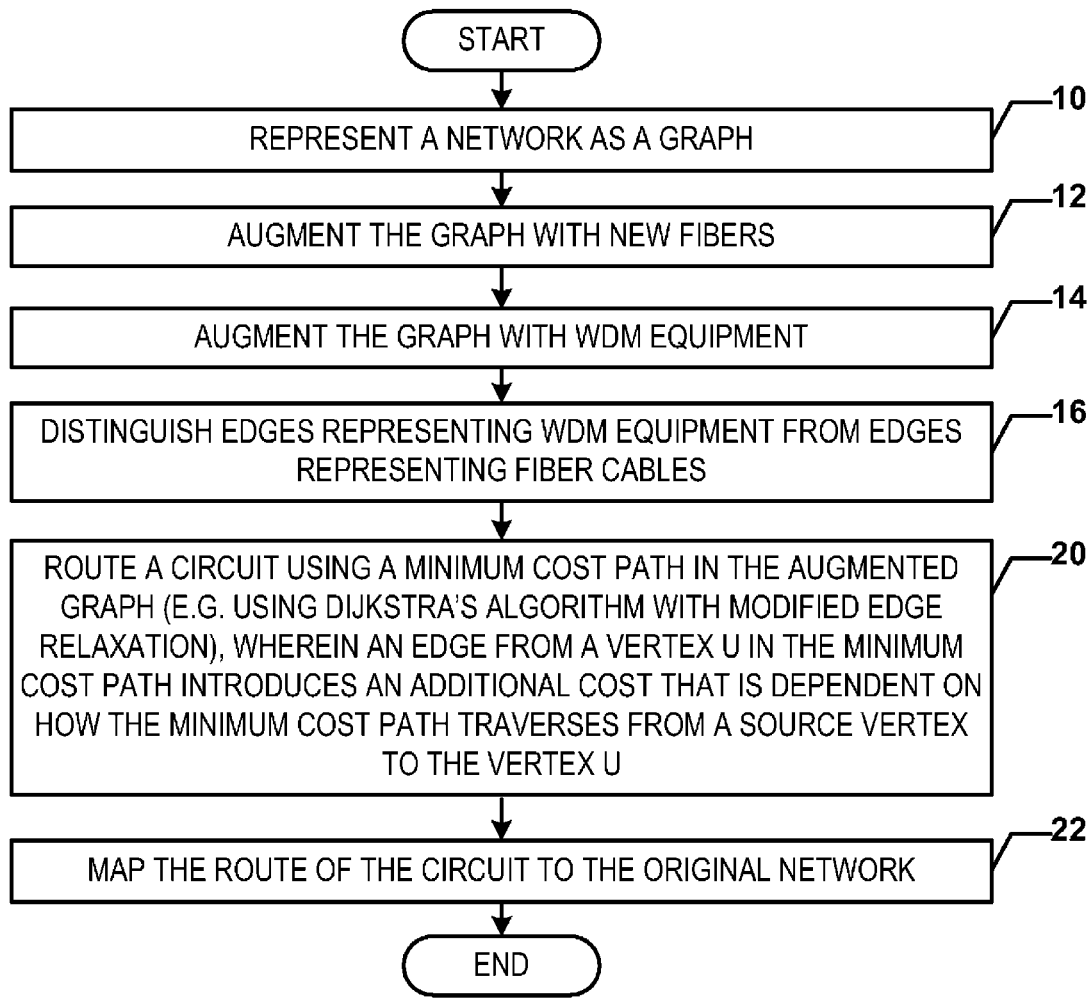
FIG. 1 is a flow chart of an embodiment of a method of routing one or more circuits.

FIG. 1 is a flow chart of an embodiment of a method of routing one or more circuits. As indicated by block 10, the method comprises representing a network as a graph. Central offices (COs) are represented by vertices of the graph, and cables are represented by edges in the graph. Each edge has one or more properties related to a number of spare fibers, distance, loss, and cost per mile of its associated cable.

As indicated by block 12, the method comprises augmenting the graph with new fibers. The graph is augmented to facilitate the laying of potential new fibers. For every two COs A and B which are directly connected to each other via a fiber cable, an edge between vertex A and vertex B is added to the graph. The edge has the following properties: a number of spare fibers is set to a number of fibers in a typical cable (generally 144), a distance is set to a distance of the original cable between CO A and CO B, a loss is set to a loss of the original cable between CO A and CO B, and a cost per mile includes a cost of laying this cable.

As a result, for any two COs A and B which are adjacent to each other via a fiber cable in the original network, there exist two edges between vertex A and vertex B. One edge represents the existing fiber cable and the other edge represents a new fiber cable.

A decision on where to lay new fiber cables in subsequently performed in block 20.

As indicated by block 14, the method comprises augmenting the graph with WDM equipment. For every two COs A and B which are directly connected to each other via WDM facilities, an edge between vertex A and vertex B is added to the graph. The edge has the following properties: a number of spares is set to a number of additional wavelengths these WDM facilities can support, a distance is set to a sum of distances of physical fiber cables these WDM facilities traverse between CO A and CO B (CO A and CO B may not be physically adjacent via direct fiber cable), a loss is set to a loss between these two WDM systems.

A cost per mile is not applicable for edges representing WDM facilities. The cost of using WDM facilities is subsequently determined in block 20.

As indicated by block 16, the method comprises distinguishing edges representing WDM facilities from edges representing fiber cables. The edges may be distinguished by flagging the edges added in block 14 as edges representing WDM facilities to distinguish from edges representing fiber cables. Alternatively, the edges added in block 12 may be flagged as edges representing fiber cables.

As indicated by block 20, the method comprises routing a circuit in the augmented graph to minimize or otherwise reduce a capital expenditure cost. The capital expenditure cost is not simply an additive function of fixed edge costs for which a standard Dijkstra's algorithm can be applied. In contrast, the incremental cost of an edge from a vertex u to a vertex v may be dependent on which path is used from a source vertex to the vertex u. Thus, the edge from the vertex u to the vertex v may have a first cost for a first path from the source vertex to the vertex u, and a second cost for a second path from the source vertex to the vertex u, where the first path differs from the second path, and the first cost differs from the second cost.

In an embodiment, a modification of Dijkstra's algorithm is used to route the circuit in the augmented graph where the cost of one or more edges depends on a path from the source. Dijkstra's algorithm is a greedy algorithm that solves the single-source shortest path problem for a directed graph with nonnegative edge cost. Dijkstra's algorithm works by keeping for each vertex v the cost d[v] of the shortest path found so far between a source vertex s and the vertex v. Initially, the cost value is 0 for the source vertex s (i.e. d[s]=0), and infinity or another large number for all other vertices, representing the fact that paths leading to those vertices are unknown (i.e. d[v]=∞ or another large number for every v in V, except s). When Dijkstra's algorithm has completed, d[v] is set to a cost of the shortest path from s to v, or is set to infinity or the other large number if no such path exists.

The basic operation of Dijkstra's algorithm is edge relaxation: if there is an edge from u to v, then the shortest known path from s to u (having cost d[u]) can be extended to a path from s to v by adding edge (u, v) at the end. This path will have cost d[u]+c(u, v), where c(u, v) is the cost of the edge between u and v. If d[u]+c(u, v) is less than the current d[v], then the current value of d[v] is replaced with the new value d[u]+c(u, v). Edge relaxation is applied until all values d[v] represent the cost of the shortest path from s to v. The algorithm is organized so that each edge (u, v) is relaxed only once, when d[u] has reached its final value.

The modification disclosed herein is in edge relaxation. In Dijkstra's algorithm, the cost of a vertex v depends entirely on the cost of adjacent vertices of v. In our case, the cost of a vertex v depends on paths from the source vertex s to adjacent vertices of v. For example, if edge (u, v) corresponds to a ROADM link, an embodiment of the algorithm traces from vertex u to the source vertex for the originating ROADM node. If vertex u is the originating ROADM node, an embodiment of the algorithm traces from vertex u back to the source vertex to calculate the loss so that the algorithm can account for the cost of a client optical interface at vertex u for the path from the source vertex to u to v.

FIG. 2 is a diagram of a finite-state machine to illustrate an embodiment of the modified algorithm. Starting from a source vertex 30, a capital expenditure value is zero, a loss value is zero, and a fiber cost value is zero. To relax a neighboring vertex v from a vertex u, a state of vertex v changes either to a fiber-edge state 32 if an edge from u to v represents a fiber, or changes to a ROADM-edge state 34 if the edge from u to v represents a ROADM link. A cost calculation for the fiber-edge state 32 differs from a cost calculation for the ROADM-edge state 34, but both depend on the path from the source vertex 30. The capital expenditure value, the loss value, and the fiber cost value are updated to reflect the capital expenditure, the loss, and fiber cost from the source vertex to the current vertex v.

The process continues until the cost of a destination vertex 36 reaches its minimum. The algorithm terminates in light of the cost of a path from the source vertex 30 to a vertex u and then to v being greater than the cost of the path from the source vertex 30 to the vertex u.

Referring back to FIG. 1, as indicated by block 22, the method comprises mapping the route of the circuit to the original network. After the modified Dijkstra's algorithm terminates, a shortest path between the source vertex and a destination vertex can be mapped back to the original network as a route. The route can be outputted (printed, displayed or stored) by a computer, and can be used for planning and provisioning.

FIG. 3 is pseudocode of an embodiment of a data structure to model a capital expenditure of a path. The data structure, herein named as "PathCapEx", comprises a first value, fLoss, which represents a loss along a path. The first value may be represented in units of dB. The data structure further comprises a second value, fCapEx, which represents a capital expenditure of the path. The data structure still further comprises a third value, fFiberCost, which represents a fiber cost of the path. The data structure yet still further comprises a fourth value, nSegmentStartType, indicating how the segment starts. The fourth value may indicate one of three different types: a first type where the segment starts from a layer-3 service router (such as an Alcatel 7750), a second type where the segment starts from a ROADM node (such as a 7500 ROADM equipment) via a lambda, and a third type where the segment starts from a ROADM node via fiber. A value assignment is performed for this data structure.

FIG. 4 is pseudocode of an embodiment of a first process in an embodiment of an algorithm to find a minimum capital expenditure from a source vertex to a destination vertex. The first process, herein named as "execute", is called using the source vertex and the destination vertex as parameters. The first process comprises initializing a set of settled nodes to an empty set, initializing a set of unsettled nodes, initializing a map of minimum costs, and initializing a map of predecessors. A second process, named as "set ShortestDistance", is called for the source vertex and a distance value of zero.

FIG. 5 is pseudocode of an embodiment of the second process in an embodiment of the algorithm. The second process has a vertex v and a distance value as parameters. The second process comprises removing the vertex v from the set of unsettled nodes, set a value indicating that the distance value is the current shortest distance to the vertex v, adding the vertex v back to the set of unsettled nodes, and rebalancing a sorted set of unsettled nodes based on a new minimum cost.

Referring back to FIG. 4, after the second process is called for the source vertex, various acts are performed while the set of unsettled nodes is not a null set. The acts comprise calling a third process, herein named as "extractMin", to determined which vertex u has a minimum cost in the set of unsettled nodes.

FIG. 6 is pseudocode of an embodiment of the third process in an embodiment of the algorithm. The third process comprises finding which vertex in the set of unsettled nodes has a minimum cost, removing this vertex from the set of unsettled nodes, and returning this vertex associated with the minimum cost.

Referring back to FIG. 4, if the vertex u is equal to the destination node, then the while loop can be exited successfully. Otherwise, the while loop continues with the vertex u being added to the set of settled nodes and a relaxation process, herein named as "relaxNeighbors", being performed based on the vertex u.

FIG. 7 is pseudocode of an embodiment of a relaxation process in an embodiment of the algorithm. The relaxation process differs from a standard Dijkstra's algorithm relaxation process in that a so-far total capital expenditure of a partial path is used instead of a single hop link cost. The partial path cost is calculated based on fiber/ROADM and optics costs, which in turn is based on the composition of path elements and total dB loss along the path.

As indicated by reference numeral 80, the relaxation process comprises getting a list of neighbor vertices of the vertex u. For each neighbor vertex v of vertex u, the following acts are performed.

As indicated by reference numeral 90, if the vertex v is in the set of settled nodes, then the vertex v is skipped from further processing. Otherwise, values of fLoss, fCapEx and fFiberCost are calculated for the vertex v, and nSegmentStartType is updated for a path up to the vertex v (herein named as "path_upto_v"). The aforementioned values are calculated in a manner dependent on a link between the vertex v and the vertex u (herein named as "link(u, v)"), and in some cases dependent on how the path up to the vertex u starts.

If the link between the vertices u and v is a ROADM hop (herein referred to as Case A), then acts indicated by reference numeral 100 are performed. The acts comprise setting a value to indicate that the path up to the vertex v starts with a ROADM node via a lambda. The acts further comprise calculating the values of a loss along the path to the vertex v, the capital expenditure of the path to the vertex v, and a fiber cost of the path to the vertex v.

If the link between the vertices u and v is a ROADM auxiliary hop, then acts indicated by reference numeral 110 are performed. If the link between the vertices u and v is a ROADM auxiliary hub hop (herein referred to as Case B), then the acts comprise setting a value to indicate that the path up to the vertex v starts with a ROADM node via a lambda, and calculating the values of a loss along the path to the vertex v, the capital expenditure of the path to the vertex v, and a fiber cost of the path to the vertex v. Otherwise (herein referred to as Case C), if the path up to the vertex u starts with a router, then the acts comprise setting a value to indicate that the path up to the vertex v starts with a ROADM node via a lambda. Otherwise, if the path up to the vertex u starts with a ROADM node via fiber, then the acts comprises setting a value to indicate that the path up to the vertex v starts with a ROADM node via a lambda. Otherwise, if the path up to the vertex u starts with a ROADM node via a lambda, then the acts comprise setting a value to indicate that the path up to the vertex v starts with a ROADM node via fiber. For any of the above cases, the acts further comprise calculating the values of a loss along the path to the vertex v, the capital expenditure of the path to the vertex v, and a fiber cost of the path to the vertex v.

If the link between the vertices u and v is a fiber hop, then acts indicated by reference numeral 120 are performed. If the path up to the vertex u starts with a router (herein referred to as Case D), then the acts comprise setting a value to indicate that the path up to the vertex v starts with a router, and calculating the values of a loss along the path to the vertex v, the capital expenditure of the path to the vertex v, and a fiber cost of the path to the vertex v. Otherwise (herein referred to as Case E), if the path up to the vertex u starts with a ROADM node via fiber, then the acts comprises setting a value to indicate that the path up to the vertex v starts with a ROADM node via fiber, and calculating the values of a loss along the path to the vertex v, the capital expenditure of the path to the vertex v, and a fiber cost of the path to the vertex v.

As indicated by reference numeral 130, acts are performed to update a minimum capital expenditure cost (herein named as "minCapEx") for the path up to the vertex v. The minimum capital expenditure cost is based on the loss along the path to the vertex v, the capital expenditure of the path to the vertex v, the fiber cost of the path to the vertex v, and how the path up to the vertex v starts.

It is noted that "hCapExV" is used in the pseudocode to refer to an instance object of Class PathCapEx, and "fCapExV" is a member variable inside class object "hCapExV" and used to refer to a float type value.

As indicated by reference numeral 140, the process comprises assigning a value to indicate that the vertex u is a predecessor to the vertex v in the shortest path.

FIG. 8 is pseudocode of an embodiment of the set predecessor process in an embodiment of the algorithm. The process comprises adding a new entry to a predecessor map to indicate that the vertex u is the predecessor to the vertex v.

FIG. 9 is a table that summarizes the aforementioned Cases A, B, C, D and E. The table has columns for different possibilities of links between vertices u and v, and rows for different possibilities of segment start values for the vertex u. Based on a particular row-column combination, the table shows the segment start value for the vertex v and which one of the Cases A, B, C, D or E exists.

FIG. 10 is pseudocode of an embodiment of a process for calculating the values of a loss along the path to the vertex v, the capital expenditure of the path to the vertex v, and a fiber cost of the path to the vertex v for each of Cases A, B, C, D and E.

Pseudocode for Case A is indicated by reference numeral 150. In Case A, the loss along the path to the vertex v is set to a constant loss for a central office. The capital expenditure of the path to the vertex v is set to a capital expenditure of a minimum-capital-expenditure path to the vertex u plus an amortized cost for a lambda access module. The fiber cost of the path to the vertex v is set to the fiber cost of the minimum-capital-expenditure path to the vertex u plus an amortized cost for laying new fiber between the vertices u and v.

Pseudocode for Case B is indicated by reference numeral 152. In Case B, the loss along the path to the vertex v is set to a constant loss for a central office. The capital expenditure of the path to the vertex v is set to the capital expenditure of the minimum-capital-expenditure path to the vertex u plus two times the amortized cost for a lambda access module. The fiber cost of the path to the vertex v is set to the fiber cost of the minimum-capital-expenditure path to the vertex u.

Pseudocode for Case C is indicated by reference numeral 154. In Case C, the loss along the path to the vertex v is set to a constant loss for a central office. The capital expenditure of the path to the vertex v is set to the capital expenditure of the minimum-capital-expenditure path to the vertex u, plus a ROADM optical interface cost which is dependent on the loss along the path to the vertex u. The fiber cost of the path to the vertex v is set to the fiber cost of the minimum-capital-expenditure path to the vertex u.

Pseudocode for Case D is indicated by reference numeral 156. In Case D, the loss along the path to the vertex v is set to a loss along the minimum-capital-expenditure path to the vertex u, plus a link loss at 1550 nm for the (u, v) hop, plus a constant loss for a central office. The fiber cost of the path to the vertex v is set to the fiber cost of the minimum-capital-expenditure path to the vertex u plus a product of a link length (e.g. in miles) and a per-length-cost of spare fiber (e.g. in dollars per mile). The capital expenditure of the path to the vertex v is set to the capital expenditure of the minimum-capital-expenditure path to the vertex u plus any cost increase due to a layer-3 network router interface optics upgrade due to the additional link loss of the (u, v) hop. An example of the layer-3 network router interface is a Media Dependent Adapter (MDA) for an Alcatel 7750 service router.

Pseudocode for Case E is indicated by reference numeral 160. In Case E, the loss along the path to the vertex v is set to a loss along the minimum-capital-expenditure path to the vertex u, plus a link loss at 1550 nm for the (u, v) hop, plus a constant loss for a central office. The fiber cost of the path to the vertex v is set to the fiber cost of the minimum-capital-expenditure path to the vertex u plus a product of a link length (e.g. in miles) and a per-length-cost of spare fiber (e.g. in dollars per mile). The capital expenditure of the path to the vertex v is set to the capital expenditure of the minimum-capital-expenditure path to the vertex u plus a capital expenditure difference value. The capital expenditure difference value is equal to an optics costs associated with the fiber cost of the path to the vertex v, minus an optics cost associated with the fiber cost of the minimum-capital-expenditure path to the vertex u, plus any cost increase due to ROADM optic interface upgrade due to the additional link loss for the (u, v) hop.

It is noted that 1550 nm is a wavelength associated with a particular transmission window of fiber. Another particular transmission window of fiber has a wavelength of 1310 nm. In fiber-optic communications, WDM/DWDM technology creates a plurality of channels around the 1550 nm band window.

Each of the above cases includes checking if a destination vertex is reached. If the vertex v is a destination vertex, then an additional cost for an optical interface is added to the above-calculated value of the capital expenditure of the path to the vertex v. FIG. 11 is pseudocode of an embodiment of a process to check if a destination vertex is reached. This pseudocode shows that, if the vertex v is the destination, a cost associated with an optic interface is added to the capital expenditure of the path to the vertex v. If a segment to vertex v is from an Intermediate Office (IO) to an End Office (EO), then the cost is for layer-3 network interface optics for a switch such as a 7450 switch. Otherwise, the cost is for layer-3 network interface optics for a router, such as an MDA for a router such as a 7750 router.

After performing the process described with reference to FIG. 4, a process is performed to get the minimum cost path from the source vertex to a destination vertex. FIG. 12 is pseudocode of an embodiment of a process to get the shortest path. The process comprises retrieving the minimum cost value for the destination vertex. The process further comprises repeatedly calling a get predecessor process to work backward from the destination vertex to the source vertex in the minimum cost path. A resulting path of vertices determined by repeatedly calling the get predecessor process is reversed to generate the minimum cost path from the source vertex to the destination vertex.

FIG. 13 is pseudocode of an embodiment of the get predecessor process. The get predecessor process retrieves an entry whose key is v in the predecessor map to determine a value of the vertex u. The process returns the value of u.

Embodiments may be used in an intermediate office (IO) placement tool or a generic transport planning tool, for example.

Figure 14:
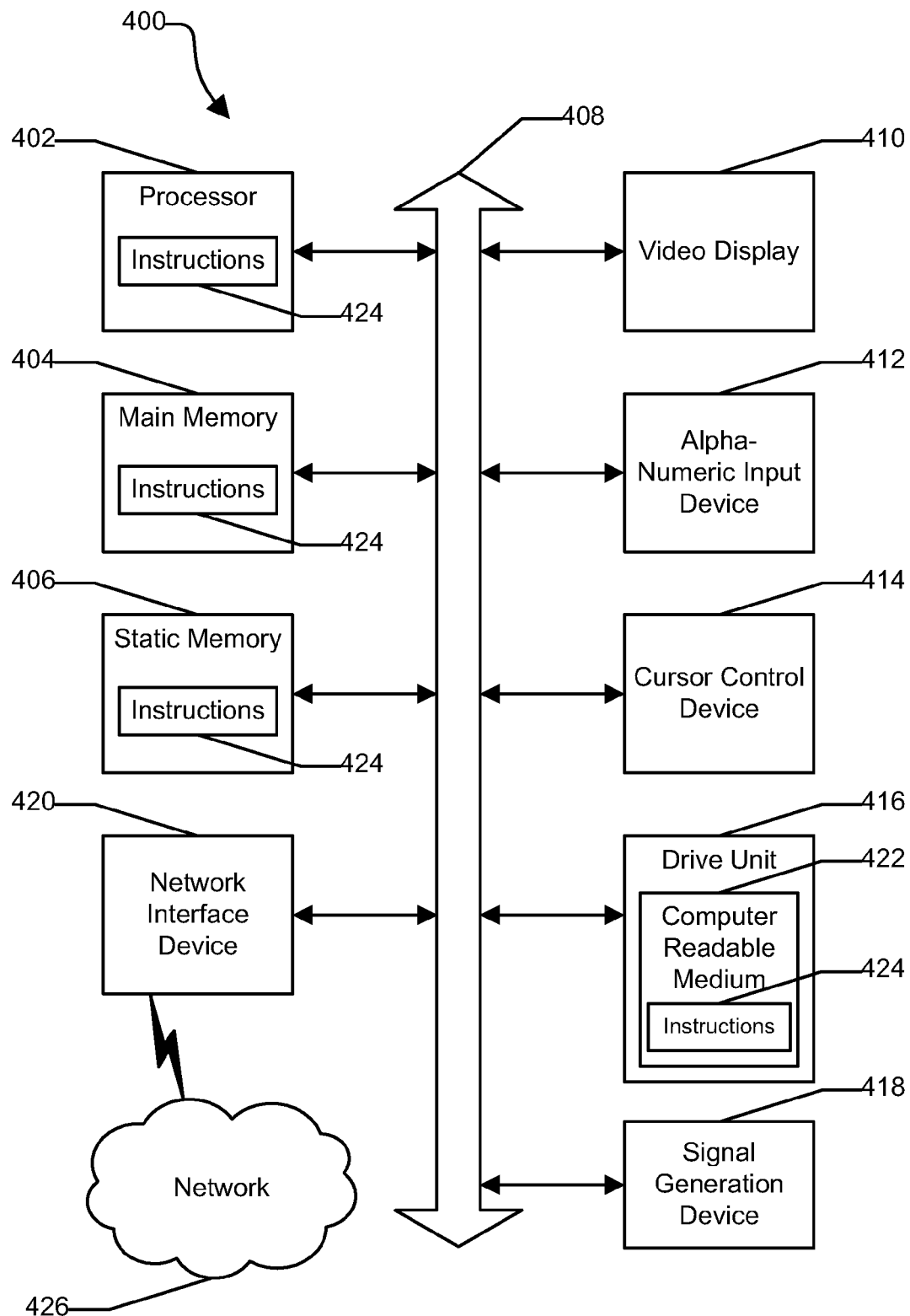
FIG. 14 is a block diagram of an illustrative embodiment of a general computer system.

Referring to FIG. 14, an illustrative embodiment of a general computer system is shown and is designated 400. The computer system 400 can include a set of instructions that can be executed to cause the computer system 400 to perform any one or more of the methods or computer based functions disclosed herein. The computer system 400 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 400 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 400 can be implemented using electronic devices that provide voice, video or data communication. Further, while a single computer system 400 is illustrated, the term "system" shall also be taken to include any collection of systems or sub-systems that individually or jointly execute a set, or multiple sets, of instructions to perform one or more computer functions.

As illustrated in FIG. 14, the computer system 400 may include a processor 402, e.g., a central processing unit (CPU), a graphics processing unit (GPU), or both. Moreover, the computer system 400 can include a main memory 404 and a static memory 406, that can communicate with each other via a bus 408. As shown, the computer system 400 may further include a video display unit 410, such as a liquid crystal display (LCD), an organic light emitting diode (OLED), a flat panel display, a solid state display, or a cathode ray tube (CRT). Additionally, the computer system 400 may include an input device 412, such as a keyboard, and a cursor control device 414, such as a mouse. The computer system 400 can also include a disk drive unit 416, a signal generation device 418, such as a speaker or remote control, and a network interface device 420.

In a particular embodiment, as depicted in FIG. 14, the disk drive unit 416 may include a computer-readable medium 422 in which one or more sets of instructions 424, e.g. software, can be embedded. Further, the instructions 424 may embody one or more of the methods or logic as described herein. In a particular embodiment, the instructions 424 may reside completely, or at least partially, within the main memory 404, the static memory 406, and/or within the processor 402 during execution by the computer system 400. The main memory 404 and the processor 402 also may include computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 424 or receives and executes instructions 424 responsive to a propagated signal, so that a device connected to a network 426 can communicate voice, video or data over the network 426. Further, the instructions 424 may be transmitted or received over the network 426 via the network interface device 420.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A computer-implemented method comprising:
representing a network using a graph, the graph comprising a plurality of vertices and a plurality of edges, the plurality of vertices comprising a source vertex, a destination vertex and a vertex u, the plurality of edges linking corresponding adjacent pairs of the plurality of vertices, the plurality of edges comprising edges corresponding to existing fiber optic cables;
augmenting the graph with additional edges representing potential new fiber optic cables such that an additional edge is added between any pair of adjacent vertices directly connected by an edge corresponding to one of the existing fiber optic cables, the additional edge having a cost corresponding to the cost of laying the new fiber optic cable; and
determining, in a processor, a minimum cost path in the graph from the source vertex to the destination vertex, wherein the vertex u is in the minimum cost path, and wherein an edge from the vertex u in the minimum cost path introduces an additional capital expenditure cost that is dependent on how the minimum cost path traverses from the source vertex to the vertex u.

2. The method of claim 1 wherein the additional capital expenditure cost depends on a loss from the source vertex to the vertex u.

3. The method of claim 1 wherein the additional capital expenditure cost depends on a composition of network elements from the source vertex to the vertex u in the minimum cost path.

4. The method of claim 1 wherein any pair of the vertices that are adjacent via a corresponding one of the existing-fiber edges are also adjacent via a corresponding one of the potential-fiber edges.

5. The method of claim 1 wherein the plurality of edges further comprise a plurality of Wavelength Division Multiplexing (WDM) edges to represent hops via WDM equipment.

6. The method of claim 5 further comprising distinguishing the plurality of fiber edges from the plurality of WDM edges.

7. The method of claim 1 wherein the edge introduces a first additional capital expenditure cost for a first path from the source vertex to the vertex u, wherein the edge introduces a second additional capital expenditure cost for a second path from the source vertex to the vertex u, wherein the first path differs from the second path, and wherein the first additional capital expenditure cost differs from the second additional capital expenditure cost.

8. The method of claim 1 wherein said determining the minimum cost path comprises, for each of a plurality of unsettled neighboring vertices of the vertex u, relaxing an unsettled neighboring vertex dependent on whether a segment start value for a path up to the vertex u represents a Reconfigurable Optical Add/Drop Multiplexer (ROADM) via lambda, a router, or ROADM via fiber.

9. The method of claim 1 wherein said determining the minimum cost path comprises, for each of a plurality of unsettled neighboring vertices of the vertex u, relaxing an unsettled neighboring vertex dependent on whether an edge from the vertex u to the unsettled neighboring vertex represents a Reconfigurable Optical Add/Drop Multiplexer (ROADM) hop, a hub ROADM auxiliary hop, a non-hub ROADM auxiliary hop, or a fiber hop.

10. The method of claim 1 wherein the additional capital expenditure cost introduced by the edge depends on a segment start value for a path up to the vertex u.

11. The method of claim 10 wherein if the segment start value for the vertex u indicates a Reconfigurable Optical Add/Drop Multiplexer (ROADM) via fiber and if the edge represents a fiber hop, then the additional capital expenditure cost introduced by the edge comprises a cost associated with a ROADM optic interface upgrade due to a link loss of the fiber hop.

12. The method of claim 10 wherein if the segment start value for the vertex u indicates a router and if the edge represents a fiber hop, then the additional capital expenditure cost introduced by the edge comprises a cost associated with a layer-3 network router interface optics upgrade due to a link loss of the fiber hop.

13. The method of claim 1, wherein if the edge represents a non-hub Reconfigurable Optical Add/Drop Multiplexer (ROADM) auxiliary hop from the vertex u to a vertex v, then the additional capital expenditure cost introduced by the edge comprises a ROADM optical interface cost dependent on a loss along a path to the vertex v.

14. The method of claim 1 wherein if the edge represents a Reconfigurable Optical Add/Drop Multiplexer (ROADM) hop from the vertex u to a vertex v, then the additional capital expenditure cost introduced by the edge comprises a cost associated with laying new fiber between the vertex u and a vertex v.

15. The method of claim 1 wherein if the edge represents a hub Reconfigurable Optical Add/Drop Multiplexer (ROADM) auxiliary hop from the vertex u to a vertex v, then the additional capital expenditure cost introduced by the edge comprises a cost associated with a lambda access module.

16. The method of claim 1 wherein the plurality of vertices comprise a vertex v that is adjacent the vertex u in the minimum cost path via the edge.

17. The method of claim 16 wherein said determining the minimum cost path comprises setting a value to indicate that a path up to the vertex v starts with a Reconfigurable Optical Add/Drop Multiplexer (ROADM) node via a lambda based on determining that the edge represents either a ROADM hop or a hub ROADM auxiliary hop.

18. The method of claim 16 wherein said determining the minimum cost path comprises setting a value to indicate that a path up to the vertex v starts with a Reconfigurable Optical Add/Drop Multiplexer (ROADM) node via fiber based on determining that the edge represents a non-hub ROADM auxiliary hop and a path up to the vertex u starts with a ROADM via lambda.

19. The method of claim 16 wherein said determining the minimum cost path comprises setting a value to indicate that a path up to the vertex v starts with a Reconfigurable Optical Add/Drop Multiplexer (ROADM) node via a lambda based on determining that the edge represents a non-hub ROADM auxiliary hop and a path up to the vertex u starts with either a router or a ROADM via fiber.

20. The method of claim 16 wherein said determining the minimum cost path comprises setting a value to indicate that a path up to the vertex v starts with a router based on determining that the edge represents a fiber hop and a path up to the vertex u starts with a router.

21. The method of claim 16 wherein said determining the minimum cost path comprises setting a value to indicate that a path up to the vertex v starts with a Reconfigurable Optical Add/Drop Multiplexer (ROADM) node via fiber based on determining that the edge represents a fiber hop and a path up to the vertex u starts with a ROADM via fiber.

22. The method of claim 1 further comprising:
routing at least a portion of a circuit from the source vertex to the destination vertex using the minimum cost path.

23. A computer system comprising:
a processor programmed to:
represent a network using a graph, the graph comprising a plurality of vertices and a plurality of edges, the plurality of vertices comprising a source vertex, a destination vertex and a vertex u, the plurality of edges linking corresponding adjacent pairs of the plurality of vertices, the plurality of edges comprising edges corresponding to existing fiber optic cables;
augment the graph with additional edges representing potential new fiber optic cables such that an additional edge is added between any pair of adjacent vertices directly connected by an edge corresponding to one of the existing fiber optic cables, the additional edge having a cost corresponding to the cost of laying the new fiber optic cable; and
determine a minimum cost path in the graph from the source vertex to the destination vertex, wherein the vertex u is in the minimum cost path, and wherein an edge from the vertex u in the minimum cost path introduces an additional capital expenditure cost that is dependent on how the minimum cost path traverses from the source vertex to the vertex u.

24. A non-transitory computer-readable storage medium encoded with a computer program, the computer program to cause a computer system to:
represent a network using a graph, the graph comprising a plurality of vertices and a plurality of edges, the plurality of vertices comprising a source vertex, a destination vertex and a vertex u, the plurality of edges linking corresponding adjacent pairs of the plurality of vertices, the plurality of edges comprising edges corresponding to existing fiber optic cables;
augment the graph with additional edges representing potential new fiber optic cables such that an additional edge is added between any pair of adjacent vertices directly connected by an edge corresponding to one of the existing fiber optic cables, the additional edge having a cost corresponding to the cost of laying the new fiber optic cable; and determine a minimum cost path in the graph from the source vertex to the destination vertex, wherein the vertex u is in the minimum cost path, and wherein an edge from the vertex u in the minimum cost path introduces an additional capital expenditure cost that is dependent on how the minimum cost path traverses from the source vertex to the vertex u.

* * * * *